United States Patent [19]
Thomas

[11] Patent Number: 6,099,639
[45] Date of Patent: Aug. 8, 2000

[54] METHOD FOR SOLID-STATE FORMATION OF DIAMOND

[75] Inventor: Michael E. Thomas, Milpitas, Calif.

[73] Assignee: National Semiconductor Corporation, Santa Clara, Calif.

[21] Appl. No.: 07/977,771

[22] Filed: Nov. 17, 1992

[51] Int. Cl.$^7$ .................................................. C30B 29/04
[52] U.S. Cl. ........................ 117/4; 117/7; 117/9; 117/929; 423/446
[58] Field of Search ..................................... 156/603, 610, 156/DIG. 68; 473/446; 117/929, 4, 7, 9

[56] References Cited

U.S. PATENT DOCUMENTS

| | | | |
|---|---|---|---|
| 4,997,636 | 3/1991 | Prins | 156/DIG. 68 |
| 5,221,411 | 6/1993 | Narayan | 423/446 |

OTHER PUBLICATIONS

Paul Denning & David Stevenson, Influence of Substrate Preparation Upon the Nucleation of Diamond Thin Films, in Russell Messier, et al., ed., New Diamond Science & Technology, at 403 (1990).

Low–Pressure Diamond Synthesis in Japan, T.R. Anthony, Second Annual Diamond Technology Initiative Seminar, Synopsis of Presentations (1987), at 169–226.

Russell Messier & Michael Frenklach, Mechanisms of Growth and Characterization of Diamond From Microwave Plasmas, Second Annual Diamond Technology Initiative Seminar (1987) 326.

B. Singh, et al., Deposition of Diamonds by Hollow Cathode and DC Plasma Assisted Low Pressure CVD, Second Annual Diamond Technology Initiative Seminar (1987) at 268.

D.W. Brenner, et al., Molecular–Dynamics Simulations of the Reaction of Atomic Hydrogen with Diamond Surfaces, in Messier, et al., eds., New Diamond Science and Technology (1991) at 39.

R. Ramesham, Selective Growth of Boron–Doped Polycrystalline Diamond Thin Films in Messier, et al., eds., New Diamond Science and Technology (1991) at 943.

S. A. Grot, et al., SemiConductor Device Development Using Selectively Grown Thin–Film Diamond, in Messier, et al., eds., New Diamond Science and Technology (1991), at 949.

W. A. Yarbrough, Thermodyanamic Issues in the Nucleation and Vapor Phase Growth of Diamond, in Messier, et al., eds., New Diamond Science and Technology (1991) at 291.

D.G.K. Jeng, et al., Light Induced Current Switching in Al/Diamond/Silicon Diodes, in Messier, et al., eds., New Diamond Science and Technology, at 963.

Stanford University Department of Materials Science and Engineering, Short Course on Diamond Films (Course Handout) (1989).

R. A. Flinn, & P.K. Trojan, Engineering Materials and Their Applications, 4th ed., pp. 196–201, (Date—Before Nov. 17, 1991).

*Primary Examiner*—Robert Kunemund
*Attorney, Agent, or Firm*—Limbach & Limbach LLP

[57] ABSTRACT

A method for solid state formation of diamond includes providing a diamond growth substrate, such as single-crystal silicon, forming on the diamond growth substrate an alloy of carbon and a metal which permits carbon to exist in a matrix therein, and causing carbon atoms from the alloy to precipitate on the diamond growth substrate in a diamond cubic lattice. The alloy may be an alloy of aluminum and carbon. The alloy is annealed in a hydrogen ambient to cause diffusion of hydrogen through the alloy to the surface of the substrate, providing a high concentration of hydrogen at the interface between the substrate and the alloy. The alloy is heated to cause carbon atoms in the alloy to diffuse through the alloy to the interface and form diamond.

11 Claims, 2 Drawing Sheets

METHOD FOR SOLID-STATE FORMATION OF DIAMOND

BACKGROUND OF THE INVENTION

This invention relates to the fabrication of semi-conductor devices, and in particular to the fabrication of diamond films for use in semiconductor devices.

Diamond possesses numerous properties which make it desirable for use in semiconductor devices. Diamond is characterized by high thermal conductivity, a wide band gap, high carrier velocities, and a high breakdown field. Diamond films would be desirable as a substitute for silicon films in high-temperature and high-frequency semiconductor devices. However, known techniques for the fabrication of diamond films do not lend themselves to easy incorporation in semiconductor device fabrication processes. One such known technique for the deposition of diamond films on various substrates, including silicon and diamond, is gas-phase deposition. In a typical gas-phase deposition process, a surface layer of silicon dioxide or similar material is provided on a substrate of silicon or diamond. A window is opened through the surface layer to the substrate. The substrate is then heated in an ambient having hydrogen and carbon-bearing species, such as methane. A typical ratio of hydrogen to methane molecules is about 100 to 1. At typical substrate temperatures around 900° C., the epitaxial growth of diamond can take place on the exposed substrate surface through the window in the $SiO_2$.

In general, high temperatures and large hydrogen to hydrocarbon ratios are required to grow diamond films using vapor-phase deposition. It would be quite attractive if low-temperature processes could be employed to grow diamond films on common substrates such as semiconductor silicon.

It is an object of this invention to provide a method for low-temperature fabrication of diamond films on a substrate.

It is a further object of this invention to provide a method for the solid-state deposition of diamond.

Additional objects and advantages of the invention will become evident from the detailed description of a preferred embodiment which follows.

SUMMARY OF THE INVENTION

A method for the solid-state formation of diamond includes the steps of providing a diamond growth substrate, forming a metal-carbon alloy on the diamond growth substrate which permits carbon to exist in a metal matrix therein, and causing carbon atoms from the alloy to form a diamond film on the diamond growth substrate while the alloy is in a solid phase.

DETAILED DESCRIPTION OF A PREFERRED EMBODIMENT

Figure 1A:
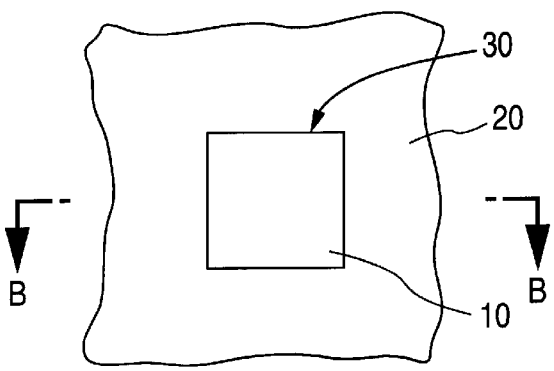
FIGS. 1A through 1H depict in schematic cross-section and plan view, the various steps in the solid-state fabrication of diamond.

This detailed description sets forth first the reasons why it is believed that the described method of solid-state fabrication of diamond would be successful. There is then set forth below a detailed description of a preferred method which, it is believed, results in the formation of diamond on a substrate.

The epitaxial growth of diamond from carbon in the gaseous and liquid phases is known. For formation of diamond from the gaseous phase, a very clean substrate of diamond or silicon is provided. There is provided an ambient having high concentrations of hydrogen with methane or a carbon-bearing species. Hydrogen to $CH_4$ ratios of typically greater than 20 to 1 are employed. At high temperatures, in excess of 900° C., it has been observed that the carbon of the methane or carbon-bearing species will nucleate and grow diamonds at the substrate surface. The hydrogen plays a role, which is not completely understood, in inhibiting the formation of graphite. In the absence of sufficient hydrogen, carbon will preferentially crystallize in the stable hexagonal crystal structure on the surface having $sp^2$ bonds. This hexagonal crystalline arrangement of carbon atoms is called graphite. However, in the presence of sufficiently high concentrations of hydrogen, $sp^3$ carbon-carbon bonds are formed and a crystal having a diamond cubic structure results. This process suppresses the formation of graphite which is the observed equilibrium form of carbon in nature.

In the gas-phase formation of diamond films, hydrogen atoms from the ambient passivate the substrate surface by tying up substantially all vacant sites on the substrate surface. In addition, a high concentration of hydrogen, relative to that of carbon, is provided at the substrate surface. As noted above, the precise mechanism by which a high concentration of hydrogen results in preferential growth of diamond is not clearly understood. However, it has been suggested that hydrogen plays a kinetic role, by preferentially etching graphite over diamond. It has also been suggested that high concentrations of hydrogen affect thermodynamic conditions at the surface of the substrate. In this model, hydrogen-occupied sites, which are periodically vacated to accommodate a hydrocarbon molecule, do not allow $sp^2$ orbitals of carbon to form. Although the $sp^2$ orbital is energetically desirable, it is inhibited from forming due to its local environment at the substrate surface. The inhibition of $sp^2$ formation and the subsequent formation of $sp^3$ bonds are dictated by the kinetic constraints imposed by the hydrogen-saturated substrate and allows the highly-stable meta-stable phase of diamond to nucleate and grow.

A similar process occurs in the solid-phase formation of epitaxial silicon on a silicon substrate. Silicon possesses a structure with $sp^3$ bonds similar to diamond. Such silicon structures have been observed to form when an aluminum-silicon alloy is disposed on a single crystal silicon substrate. In this process, an alloy of aluminum and silicon is disposed on a single crystal silicon substrate. The alloy of aluminum and silicon is heated near the eutectic temperature of the aluminum-silicon system, which causes silicon atoms in the alloy to diffuse to the interface between the underlying silicon substrate and the alloy. The silicon from the alloy then nucleates on the substrate surface, forming a crystal structure having $sp^3$ bonds. Thus, a solid-phase alloy of aluminum and silicon will permit the formation of diamond cubic crystal structures having $sp^3$ bonding.

Carbon tends to diffuse rapidly in a number of face-centered cubic and body-centered cubic metals, at moderate temperatures. Aluminum has a face-centered cubic lattice structure, and the inventor believes that carbon can be rapidly transported through it by diffusion under solid-state conditions. As thin films are contemplated, for use in a method of the present invention, the diffusion time should be relatively small.

The inventor accordingly believes that the solid phase of an aluminum-carbon alloy will permit the formation of crystalline structures of carbon having $sp^3$ bonds, in the same manner that an alloy of aluminum and silicon permits the formation of silicon crystal structures having $sp^3$ bonds.

As the diffusivity of carbon in aluminum is believed to be high, it is believed that carbon atoms in an aluminum-carbon alloy disposed on a substrate will diffuse to the interface between the substrate and the aluminum-carbon alloy.

It is also known that hydrogen diffuses rapidly through aluminum. Thus it is believed that providing an aluminum-carbon alloy on an appropriate substrate, such as diamond or single-crystal silicon, and heating the alloy in a hydrogen ambient will result in the diffusion of hydrogen and carbon atoms to the metal alloy-substrate interface. As noted above, in the gas-phase formation of diamond films, a high ratio of hydrogen to carbon at the surface of an appropriate substrate results in preferential formation of diamond rather than graphite. The formation of crystals having $sp^3$ bonds, such as diamond, is deemed possible by using an alloy to control the action of hydrogen and carbon at the substrate-alloy interface. Consequently, it is believed that the solid-phase growth of diamond will be achieved by providing a "diamond growth substrate," forming a metal-carbon alloy on the diamond growth substrate, which metal-carbon alloy permits carbon to exist in a metal matrix therein, and causing carbon atoms from the alloy to form diamond on the diamond growth substrate while the alloy remains in the solid phase. A diamond growth substrate means a substrate that bonds with hydrogen such that, when a site becomes available on one of the atoms of the substrate, carbon will form in an $sp^3$ hybrid structure.

Figure 1B:
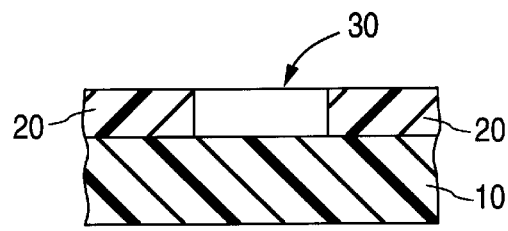

A preferred method of fabricating diamond in the solid state will now be described in detail. Referring to FIG. 1A, there is depicted in plan view substrate 10 having a dielectric layer 20 disposed thereon and a window 30 through dialectic layer 20 to the surface of substrate 10. FIG. 1B is a cross-section along line B—B of FIG. 1A. Substrate 10 is a diamond growth substrate. By way of example, substrate 10 may be a poly-crystalline material having a face-centered cubic structure. By way of specific example, substrate 10 may be of silicon. By way of further example, substrate 10 may be of diamond or silicon carbide.

Dielectric layer 20 may be any conventional dielectric. For example, dielectric layer 20 may be of silicon dioxide, and may be formed by conventional oxidation or deposition techniques known in the art. Dielectric layer 20 may be, for example, about 1000 Angstroms in thickness. The precise thickness of dielectric layer 20 is not important in the practice of a method of the invention.

Window 30 through dielectric layer 20 to the surface of substrate 10 may be formed by conventional masking and etching techniques performed on dielectric layer 20. The dimensions of window 30 may be selected depending on the desired dimensions of the diamond film. After window 30 is defined, the exposed surface of substrate 10 in window 30 must be cleaned of all remaining dielectric, and of any oxides that may have formed on the surface. In addition, the substrate surface must be passivated such that minimal oxide is formed prior to the deposition of the aluminum-carbon alloy. This is done by dipping the wafer in a 1 to 10 $HF/H_2O$ solution for a period of 5 seconds. The solution removes any oxides in the window area from the substrate surface. The wafer is then quickly rinsed in deionized $H_2O$ prior to insertion in the vacuum. Rinsing in deionized water should be limited to 5 seconds. This will wash any HF off the oxide regions. Rinsing will replace some fluorine atoms attached to silicon sites with hydrogen or hydroxyls. If a blank silicon wafer with no oxide were used, rinsing would not be necessary. The fluorine ions in the HF solution passivate the substrate surface by bonding to substantially all available bonding sites on the surface. During the deionized water rinse, some of these atoms can be replaced by H or OH species. However, if exposure time in deionized water is low, this will be a small fraction of surface coverage. Techniques of opening a window and obtaining a clean, passivated substrate surface are known in connection with the selective gas-phase deposition of diamond.

Figure 1C:
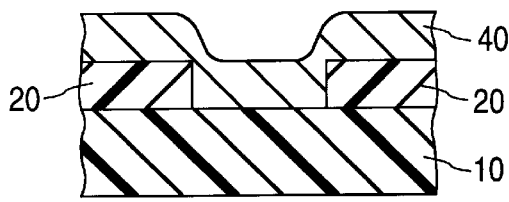

The next step is the step of providing on the exposed surface of substrate 10 an alloy of a metal and carbon, which metal allows carbon to exist in the matrix. As discussed above, the inventor believes that an aluminum-carbon alloy will allow carbon to exist and freely move in the matrix. The forming of an aluminum-carbon alloy on the exposed portion of substrate 10 may be performed by, referring to FIG. 1C, depositing first layer 40 of aluminum on the exposed portion of substrate 10 and on dielectric layer 20. First aluminum layer 40 may be formed by conventional deposition techniques, such as sputtering. The wafer is placed in a vacuum, at a pressure of less than $1\times10^{-7}$ Torr, prior to admitting argon gas at a pressure of $2\times10^{-3}$ Torr, in order to initiate a sputtering plasma which is responsible for the generation of an aluminum vapor in the vacuum system. The thickness of first aluminum layer 40 may be from about 500 Angstroms to about 10,000 Angstroms, and is preferably about 3,000 Angstroms. The surface of the substrate remains passivated by the fluorine provided in the wet etch unless the substrate is heated in vacuum. This process removes some or all of the fluorine and provides a highly-clean surface prior to aluminum alloy deposition. After aluminum deposition, aluminum atoms will become bonded to a large number of sites at the substrate interface.

Figure 1D:
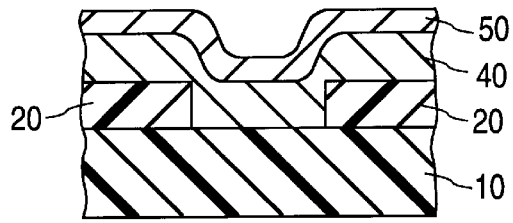

Referring now to FIG. 1D, there has been formed on first aluminum layer 40 carbon layer 50. Carbon layer 50 is preferably formed by sputtering techniques similar to the aluminum sputtering techniques described above. The thickness of carbon layer 50 may be from about 100 Angstroms to about 1000 Angstroms and is preferably about 200 Angstroms. Carbon layer 50 is preferably formed on first aluminum layer 40 without breaking vacuum. If first aluminum layer 40 were exposed to air, oxides of aluminum would be formed on the surface of aluminum layer 40. Such oxides would be impurities in the alloy, which would interfere with the subsequent diffusion of carbon and the formation of diamond. Preferably, an aluminum deposition source and a separate carbon deposition source are both provided in the vacuum chamber. These techniques are well known to those of skill in the art.

Figure 1E:
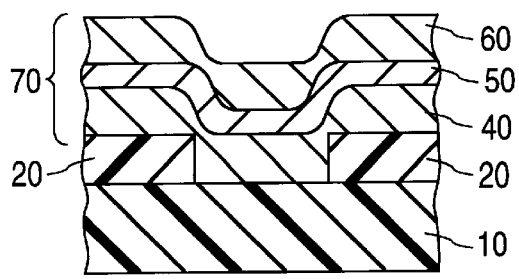

Referring now to FIG. 1E, there is formed on carbon layer 50 second aluminum layer 60. Second aluminum layer 60 is preferably formed by conventional techniques, such as by sputtering. Second aluminum layer 60 may have a thickness from about 500 to about 10,000 Angstroms, and preferably has a thickness of about 3,000 Angstroms. Second aluminum layer 60 is preferably formed on carbon layer 50 without breaking vacuum. First aluminum layer 40, carbon layer 50, and second aluminum layer 60 together comprise aluminum-carbon alloy layer 70.

Aluminum-carbon alloy layer 70 preferably has a carbon to aluminum ratio of about three percent by weight. Preferably, the range of the carbon to aluminum ratio is between about 0.05% and about 5% by weight. Second aluminum layer 60 encapsulates and serves to prevent the formation, on the surface of carbon layer 50, of compounds of carbon detrimental to the clear formation of diamond films.

The next step is to cause carbon atoms in aluminum-carbon alloy layer 70 to diffuse and precipitate on the surface of substrate 10 into a diamond cubic crystal form. In order to do so, it is necessary initially to place the substrate and alloy into an ambient having a high concentration of hydrogen atoms relative to the concentration of carbon atoms at the interface of substrate 10 and alloy 70. This is done by providing a hydrogen ambient at a temperature between room temperature and about 500° C., and preferably about 400° C., a partial pressure between about 0.1 atmosphere and about 1 atmosphere, and preferably about 1 atmosphere, and a flow rate between about zero and about 1000 sccm, and preferably about 500 sccm. High pressure hydrogen of many atmospheres could also be used to enhance the diamond growth process. This would result in diffusion of large quantities of hydrogen into the alloy. The hydrogen will diffuse through aluminum-carbon alloy layer 70 to the exposed surface of substrate 10. Second aluminum layer 60 serves as a filter that permits hydrogen to diffuse from the ambient to the substrate surface, but will not permit significant diffusion of other atoms or molecules. This is because the diffusivity of hydrogen in aluminum is much higher than that of other elements in aluminum. It is also possible to use an argon-hydrogen mixture during sputtering of the aluminum to incorporate hydrogen in the aluminum film. This will eliminate the need for a pre-diffusion of hydrogen. One could also simultaneously deposit aluminum and carbon in the sputtering ambients of argon and hydrogen, by using two targets simultaneously, for example. Other methods could be used, such as sputtering aluminum in a $CH_4/H_2$ ambient.

During the diffusion of hydrogen in to the aluminum-carbon alloy, the thermal energy provided will cause carbon atoms from carbon layer 50 to diffuse to the surface of substrate 10. Substrate 10 and alloy layer 70 of FIG. 1E are accordingly heated. Substrate 10 and alloy layer 70 may be heated up to a temperature between about 350° C. and about 530° C. A preferred temperature is about 530° C. Since hydrogen is a much smaller atom than carbon, it is expected that this molecule will easily get to the substrate interface before carbon from layer 50. Due to this situation, hydrogen will form bonds with silicon at the interface prior to the arrival of carbon.

As a result of the heating, carbon atoms from carbon layer 50 will tend to diffuse into first aluminum layer 40 and to the interface between aluminum-carbon alloy 70 and substrate 10. When carbon atoms reach the interface of substrate 10, they will replace some of the hydrogen and aluminum bonds at the interface. As a result of the high concentration of hydrogen atoms at the interface between substrate 10 and aluminum-carbon alloy layer 70, the carbon atoms are expected t o preferentially form $sp^3$ bonds, and support the nucleation and growth of a diamond cubic configuration of carbon. This is the same phenomenon that has been observed in the gas-phase deposition of diamond. It is important that the concentration of hydrogen relative to the concentration of carbon at the interface be kept sufficiently high such that the carbon atoms will preferentially form $sp^3$ bonds. If the concentration of hydrogen atoms is not sufficiently high at the interface, the carbon atoms can form $sp^2$ bonds, resulting in the growth of graphite. It is believed that a ratio of about 100 hydrogen atoms for each carbon atom will be a sufficiently high concentration of hydrogen at the interface.

Figure 1F:
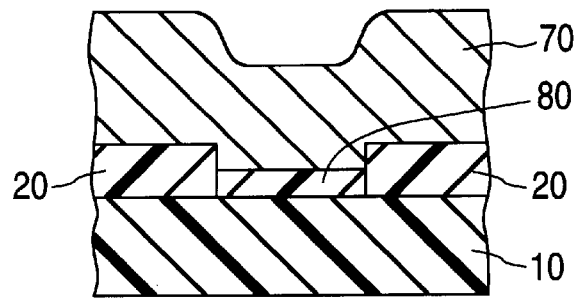
Figure 1G:
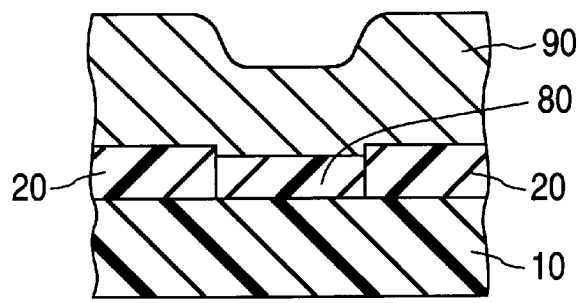

Referring now to FIG. 1F, after heating for a short period of time in a hydrogen ambient, a layer 80 of diamond has begun to grow on the exposed portions of substrate 10 in window 30. Carbon atoms from carbon layer 50 (shown in FIG. 1E) have substantially diffused into first aluminum layer 40 (shown in FIG. 1E). There is represented in FIG. 1F only aluminum-carbon alloy layer 70, as there are no longer a distinct first aluminum layer 40 and carbon layer 50. Diamond layer 80 at the interface will continue to experience growth until a substantial fraction of the available carbon has diffused through the aluminum lattice and has become bonded to the diamond structure 80. As shown in FIG. 1G, there is thus only aluminum layer 90 with a small amount of soluble carbon disposed over diamond layer 80.

The precise period of time that the hydrogen ambient and the substrate temperature must be maintained to cause a substantial fraction of the carbon atoms in the alloy to be included in the diamond matrix depends on the quantities of aluminum and carbon, the thickness of the layers, and the temperatures employed. If the conditions are maintained on the order of two to three hours, at a temperature of 530° C., it is expected that a substantial fraction of the carbon atoms in the alloy will rearrange to form a diamond matrix.

Figure 1H:
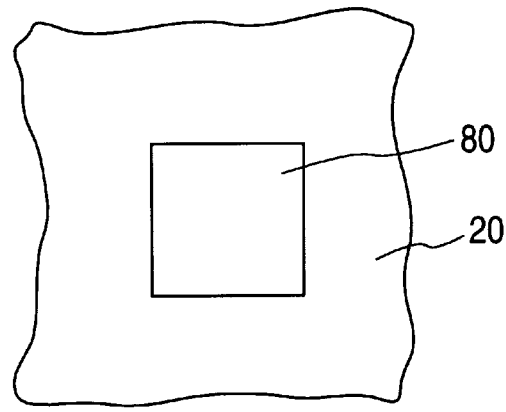

If desired, the aluminum layer 90 may be removed by use of a suitable solvent or etchant that dissolves aluminum but does not substantially attack diamond. The result of this step of etching is shown in FIG. 1H. The selectively-grown diamond layer 80 may then be used for a wide variety of purposes.

The following examples are examples that describe the manner and process of performing embodiments of the invention which has not actually been conducted.

EXAMPLE 1

A single crystal silicon wafer of 6 inch diameter having an oxide layer of 2000 Angstroms in thickness, with a square window of length 10 microns on each side defined through the oxide layer to the substrate is dipped in an 10 to 1 $HF/H_2O$ solution for a period of 10 seconds to remove the native silicon oxide. The wafer is rinsed for 5 seconds in deionized $H_2O$ and then placed in a vacuum deposition system capable of performing sputtering deposition of aluminum and carbon and capable of attaining a base pressure of below $1\times10^{-7}$ Torr. The pressure is brought to $1\times10^{-7}$ Torr. Argon gas is admitted into the chamber to raise the pressure in the chamber to $2\times10^{-3}$ Torr. The substrate is heated to a temperature of 300° C. for 10 minutes, and then aluminum is deposited onto it to a thickness of about 3,000 Angstroms. Carbon is then sequentially deposited on the aluminum film to a thickness of about 200 Angstroms, followed by a second aluminum deposition to a thickness of about 3,000 Angstroms. The wafer is removed from the system and placed into a furnace under a pure hydrogen ambient at a pressure of one atmosphere and temperature of 530° C. The hydrogen ambient is maintained at this pressure and temperature for a period of one hour. The inventor believes that, by following the procedure of this example, diamond will be formed on the exposed substrate interface in the window. The aluminum film is then removed by conventional etching techniques.

EXAMPLE 2

A single crystal silicon wafer of 6 inch diameter having an oxide layer of 2000 Angstroms in thickness, with a square window of length 10 microns on each side defined through the oxide layer to the sbustrate is dipped in a 10 to 1 $HF/H_2O$ solution for a period of 10 seconds to remove the native silicon oxide. The wafer is rinsed for 5 seconds in deionized water and then placed in a vacuum deposition system capable of performing sputtering deposition of aluminum and carbon and capable of attaining a base pressure of below $1\times10^{-7}$ Torr. The pressure is brought to $1\times10^7$ Torr. A mixture of argon and hydrogen gas is admitted into the chamber to raise the pressure in the chamber to $2 \times 10^{-3}$ Torr. The substrate is heated to a temperature of 300° Celsius for ten minutes, and then aluminum is deposited on to it to a thickness of about 500 Angstroms. Carbon is then sequentially deposited on the aluminum film to a thickness of about 100 Angstroms, followed by a second aluminum deposition to a thickness of about 500 Angstroms. The wafer is removed from the system and placed into a furnace under a pure hydrogen ambient at a pressure of 1 atmosphere and a temperature of 530° Celsius. The hydrogen ambient is maintained at this pressure and temperature for a period of one hour. The inventor believes that, by following the procedure of this example, diamond will be formed on the exposed substrate interface in the window. The aluminum film is then removed by conventional etching techniques.

The foregoing process of the invention is believed to provide the formation of diamond films in a low-temperature process. The process of the invention can be integrated into semiconductor device and IC fabrication processes and provide solid-state selective diamond growth at low process temperatures.

Numerous variations on the preferred embodiment and examples listed above are believed to be feasible. For example, the diamond growth substrate may comprise FCC crystals other than silicon. It is believed that, in place of aluminum, other metals may be used in the alloy to support this process.

It will be appreciated that there are considerable variations that can be accomplished in a method according to the invention without departing from its scope. As a result, although a preferred embodiment of a method of the invention has been described above, it is emphasized that the invention is not limited to a preferred embodiment and that there exist other alternative embodiments that are fully encompassed within the invention's scope, which is intended to be limited only by the scope of the appended claims.

What is claimed is:

1. A method for solid-state formation of diamond, comprising the steps of:
   (a) providing a diamond growth substrate;
   (b) forming a metal-carbon alloy on said diamond growth substrate which permits carbon to exist in a metal matrix therein; and
   (c) causing carbon atoms from said alloy to form diamond on said diamond growth substrate while said alloy is in a solid phase.

2. The method of claim 1, wherein said step (a) comprises providing a silicon substrate.

3. The method of claim 1, wherein said step (b) comprises forming an aluminum-carbon alloy layer on the substrate.

4. The method of claim 3, wherein said step of forming an aluminum-carbon alloy layer comprises the step of forming an aluminum-carbon alloy which is from about 0.05 percent to about 5 percent by weight carbon.

5. The method of claim 3, wherein said step of forming an aluminum-carbon alloy layer comprises the steps of forming a first aluminum layer on the substrate, forming a carbon layer on said first aluminum layer, and forming a second aluminum layer on said carbon layer.

6. The method of claim 3, wherein said step of forming an aluminum-carbon alloy layer comprises sputtering aluminum on the substrate in an ambient of argon and hydrogen.

7. The method of claim 1, wherein said step (c) comprises the step of providing a high concentration of hydrogen in said alloy at the interface between said alloy and said substrate.

8. The method of claim 7, wherein said step of providing a high concentration of hydrogen comprises the step of disposing said alloy in a hydrogen ambient to cause hydrogen from said ambient to diffuse through said alloy to the interface between said substrate and said alloy.

9. The method of claim 7, wherein said step (c) further comprises heating said alloy to a temperature of between about 350° Celsius and about 530° Celsius.

10. The method of claim 1, wherein said step (b) comprises providing an aluminum-carbon alloy, and said step (c) comprises heating said alloy to a temperature of between about 350° Celsius and about 530° Celsius.

11. The method of claim 1, further comprising the step of passivating the surface of said diamond growth substrate prior to said step (b).

* * * * *